US011000909B2

(12) United States Patent
Rizzo, Jr. et al.

(10) Patent No.: US 11,000,909 B2
(45) Date of Patent: May 11, 2021

(54) ELECTRICAL DISCHARGE MACHINING ELECTRODE

(71) Applicant: United Technologies Corporation, Farmington, CT (US)

(72) Inventors: John P. Rizzo, Jr., Vernon, CT (US); Gordon Miller Reed, Plantsville, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 533 days.

(21) Appl. No.: 15/848,376

(22) Filed: Dec. 20, 2017

(65) Prior Publication Data

US 2018/0133825 A1  May 17, 2018

Related U.S. Application Data

(62) Division of application No. 13/466,183, filed on May 8, 2012, now Pat. No. 9,878,387.

(51) Int. Cl.
*B23H 1/06* (2006.01)
*C23C 16/27* (2006.01)
*H01R 43/16* (2006.01)
*B23H 9/10* (2006.01)

(52) U.S. Cl.
CPC ............... *B23H 1/06* (2013.01); *B23H 9/10* (2013.01); *H01R 43/16* (2013.01); *C23C 16/27* (2013.01); *Y10T 29/49204* (2015.01)

(58) Field of Classification Search
CPC ............... B23H 9/10; B23H 1/04; B23H 1/00
See application file for complete search history.

(56) References Cited

U.S. PATENT DOCUMENTS

| | | | |
|---|---|---|---|
| 3,420,759 A | 1/1969 | Inoue | |
| 3,936,577 A | 2/1976 | Christini et al. | |
| 4,013,863 A * | 3/1977 | van Osenbruggen | B23H 1/08 219/69.14 |
| 4,079,552 A | 3/1978 | Fletcher | |
| 4,396,077 A | 8/1983 | Radtke | |
| 4,610,932 A * | 9/1986 | Haynes | H01H 1/02 420/441 |
| 4,641,007 A | 2/1987 | Lach | |
| 4,732,364 A | 3/1988 | Seger et al. | |
| 4,740,666 A | 4/1988 | Tomalin et al. | |
| 4,797,527 A | 6/1989 | Yamamoto et al. | |
| 4,849,599 A * | 7/1989 | Kuromatsu | B23H 5/06 219/69.17 |

(Continued)

OTHER PUBLICATIONS

Spear, Karl. "Diamond-Ceramic Coating of the Future". J.Am. Ceramic Society., vol. 72[2] 171-197 (1989) retrieved from https://ceramics.org/wp-content/uploads/2009/03/spear_diamond.pdf (Year: 1989).*

(Continued)

*Primary Examiner* — Robert J Utama
*Assistant Examiner* — Lawrence H Samuels
(74) *Attorney, Agent, or Firm* — Carlson, Gaskey & Olds, P.C.

(57) ABSTRACT

An exemplary method of manufacturing an electrical discharge machining electrode includes, among other things, immersing at least a portion of an electrode base in a fluid, and electroplating an electrode coating containing diamond to an electrode base.

9 Claims, 4 Drawing Sheets

(56) References Cited

U.S. PATENT DOCUMENTS

| | | | |
|---|---|---|---|
| 4,992,639 A | 2/1991 | Watkins et al. | |
| 5,482,602 A | 1/1996 | Cooper et al. | |
| 5,870,663 A * | 2/1999 | Stucker | B23H 1/06 419/12 |
| 6,515,218 B1 | 2/2003 | Shimizu et al. | |
| 7,377,477 B2 * | 5/2008 | Lucek | B29C 33/56 249/114.1 |
| 7,926,184 B2 | 4/2011 | Clemens | |
| 2002/0015793 A1 * | 2/2002 | Lee | C30B 29/02 427/383.1 |
| 2002/0015794 A1 | 2/2002 | Collins | |
| 2005/0133277 A1 | 6/2005 | Dixon | |
| 2005/0136667 A1 * | 6/2005 | Sung | B01J 3/062 438/689 |
| 2005/0173834 A1 * | 8/2005 | Lucek | B29C 33/56 264/319 |
| 2005/0178744 A1 * | 8/2005 | Suzuki | B23H 1/06 219/69.15 |
| 2006/0280946 A1 | 12/2006 | Cooper et al. | |
| 2007/0289871 A1 | 12/2007 | Hafezi et al. | |
| 2007/0295696 A1 | 12/2007 | Nabekura et al. | |
| 2007/0298696 A1 | 12/2007 | Blatz | |
| 2008/0158682 A1 * | 7/2008 | Egi | G02B 1/118 359/601 |
| 2008/0298920 A1 | 12/2008 | Janssen et al. | |
| 2009/0014322 A1 | 1/2009 | Ramarajan et al. | |
| 2009/0208344 A1 * | 8/2009 | Jabado | B23H 9/16 416/97 R |
| 2010/0319183 A1 | 12/2010 | Hulseman et al. | |
| 2011/0073464 A1 * | 3/2011 | Luo | B23H 3/06 204/224 M |
| 2011/0108526 A1 | 5/2011 | Kishimoto et al. | |

OTHER PUBLICATIONS

Telling, R.H., et al.(2000), Theoretical Strength and Cleavage of Diamond, Physical Review Letters, 84(22), pp. 5160-5163. Retrieved on Dec. 24, 2014 from http://www.tcm.phy.cam.ac.uk/-cjp20/old/publications/PRL84_5160.pdf.

Conference Proceedings, vol. 11, 10th Anniversary International Conference of the European Society for Precision Engineering and Nanotechnology, May 18-May 22, 2008, Kongresshaus Zurich, Switzerland, pp. 478-483.

International Search Report and Written Opinion for International Application No. PCT/US2013/039593 completed on Aug. 21, 2013.

International Preliminary Report on Patentability for PCT Application No. PCT/US2013/039593, dated Nov. 20, 2014.

* cited by examiner

ELECTRICAL DISCHARGE MACHINING ELECTRODE

CROSS-REFERENCE TO RELATED APPLICATION

This application is a divisional of U.S. patent application Ser. No. 13/466,183, which was filed on 8 May 2012 and is incorporated herein by reference.

BACKGROUND

This disclosure relates generally to an electrical discharge machining electrode.

Electrical discharge machining is a manufacturing process that establishes a desired shape in a component using electrical discharges sent from an electrode. Moving the electrode toward the component causes the electrical discharges to flow from a charged electrode to the component. More material is removed from areas of the component that are closer to the electrode than from areas of the component that are further from the electrode. Material is removed from the component until the component has the contour that mimics the contour of the electrode. The contour of the electrode reflects a desired contour of the component.

Electrodes used in electrical discharge machining include consumable copper and graphite electrodes. These electrodes must be replaced or redressed after each electrical discharge machining operation.

SUMMARY

An electrical discharge machining electrode assembly according to the present disclosure includes, among other things, an electrode base, and an electrode coating containing diamond that is electroplated to the electrode base.

In a further non-limiting embodiment of the foregoing electrical discharge machining electrode assembly, the coating may comprise a chemical vapor deposition diamond material.

In a further non-limiting embodiment of either of the foregoing electrical discharge machining electrode assemblies, the electrode coating may comprise a polycrystalline diamond material.

In a further non-limiting embodiment of any of the foregoing electrical discharge machining electrode assemblies, the polycrystalline diamond material may be sintered with boron.

In a further non-limiting embodiment of any of the foregoing electrical discharge machining electrode assemblies, the electrode may be a non-consumable electrode.

In a further non-limiting embodiment of any of the foregoing electrical discharge machining electrode assemblies, the electrode may be a copperless electrode.

In a further non-limiting embodiment of any of the foregoing electrical discharge machining electrode assemblies, the electrode may be a graphiteless electrode.

In a further non-limiting embodiment of any of the foregoing electrical discharge machining electrode assemblies, the electrode may be a reusable electrode.

In a further non-limiting embodiment of any of the foregoing electrical discharge machining electrode assemblies, the electrode may have a contour mimicking a contour of a turbomachine component.

In a further non-limiting embodiment of any of the foregoing electrical discharge machining electrode assemblies, the electrode coating may have a [111] crystal graphic direction.

An electrical discharge machining assembly according to another exemplary aspect of the present disclosure includes, among other things, an electrode having a portion that is electroplated with a coating containing diamond, and a power supply configured to power the electrode. The current may selectively move from the electrode to a component to remove material from the component when the electrode is powered.

In a further non-limiting embodiment of the foregoing electrical discharge machining assembly, the coating containing diamond may comprise a chemical vapor deposition diamond.

In a further non-limiting embodiment of either the foregoing electrical discharge machining assemblies, the coating containing diamond may comprise a polycrystalline diamond.

A method of manufacturing an electrical discharge machining electrode according to another exemplary aspect of the present disclosure includes, among other things, immersing at least a portion of an electrode base in a fluid, and electroplating an electrode coating containing diamond to an electrode base.

In a further non-limiting embodiment of the foregoing method of manufacturing an electrical discharge machining electrode, the electrode coating may be formed from a material comprising a liquid diamond.

In a further non-limiting embodiment of either of the foregoing methods of manufacturing an electrical discharge machining electrode, the electrode coating may be formed from a material comprises a solid diamond crystal.

In a further non-limiting embodiment of either of the foregoing methods of manufacturing an electrical discharge machining electrode, the electroplating of the electrode coating to the electrode base provides an electrical discharge machining electrode.

In a further non-limiting embodiment of either of the foregoing methods of manufacturing an electrical discharge machining electrode, the method includes using the electrical discharge machining electrode to electrically discharge machine a first component.

In a further non-limiting embodiment of either of the foregoing methods of manufacturing an electrical discharge machining electrode, the method includes reusing the electrical discharge machining electrode to electrically discharge machine a second component.

In a further non-limiting embodiment of either of the foregoing methods of manufacturing an electrical discharge machining electrode, the reusing is without replacing or redressing the electrical discharge machining electrode.

In a further non-limiting embodiment of either of the foregoing methods of manufacturing an electrical discharge machining electrode, the electrode has a contour mimicking a contour of a turbomachine component of a gas turbine engine.

In a further non-limiting embodiment of either of the foregoing methods of manufacturing an electrical discharge machining electrode, the electrode coating has a [111] crystal graphic direction.

In a further non-limiting embodiment of either of the foregoing methods of manufacturing an electrical discharge machining electrode, the coating containing diamond comprises a chemical vapor deposition diamond.

In a further non-limiting embodiment of either of the foregoing methods of manufacturing an electrical discharge machining electrode, the coating containing diamond comprises a polycrystalline diamond.

A method of manufacturing an electrical discharge machining electrode according to yet another exemplary aspect of the present disclosure includes immersing at least a portion of an electrode base in a fluid, and electroplating an electrode coating having a [111] crystal graphic direction and containing diamond to an electrode base to provide an electrical discharge machining electrode.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 1:
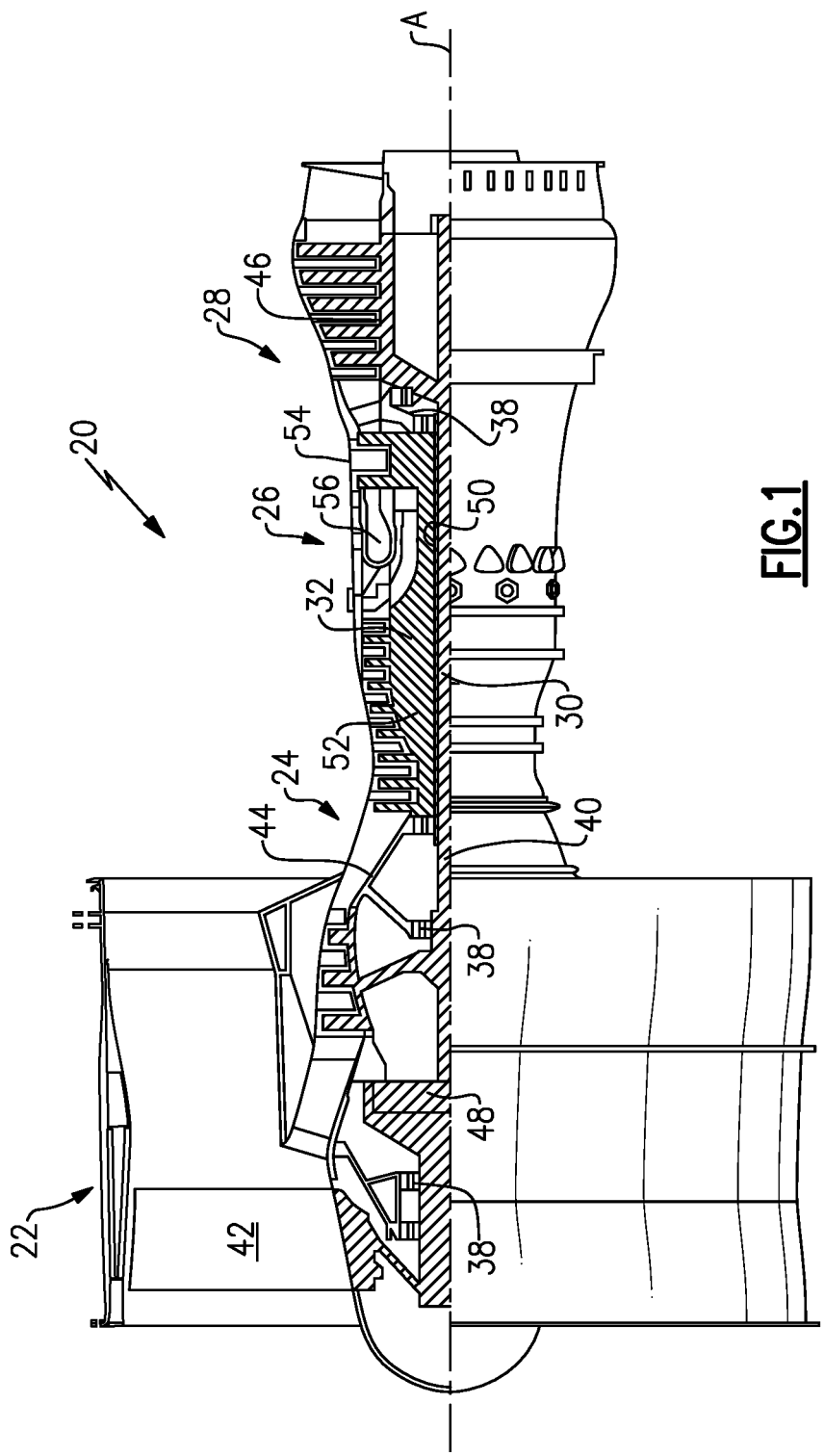
FIG. 1 shows a cross-section view of an example gas turbine engine.

FIG. 1 schematically illustrates an example turbomachine, which is a gas turbine engine 20 in this example. The gas turbine engine 20 is a two-spool turbofan gas turbine engine that generally includes a fan section 22, a compressor section 24, a combustion section 26, and a turbine section 28.

Although depicted as a two-spool turbofan gas turbine engine in the disclosed non-limiting embodiment, it should be understood that the concepts described herein are not limited to use with turbofans. That is, the teachings may be applied to other types of turbomachines and turbine engines including three-spool architectures.

In the example engine 20, flow moves from the fan section 22 to a bypass flowpath. Flow from the bypass flowpath generates forward thrust. The compressor section 24 drives air along the core flowpath. Compressed air from the compressor section 24 communicates through the combustion section 26. The products of combustion expand through the turbine section 28.

The example engine 20 generally includes a low-speed spool 30 and a high-speed spool 32 mounted for rotation about an engine central axis A. The low-speed spool 30 and the high-speed spool 32 are rotatably supported by several bearing systems 38. It should be understood that various bearing systems 38 at various locations may alternatively, or additionally, be provided.

The low-speed spool 30 generally includes an inner shaft 40 that interconnects a fan 42, a low-pressure compressor 44, and a low-pressure turbine 46. The inner shaft 40 is connected to the fan 42 through a geared architecture 48 to drive the fan 42 at a lower speed than the low-speed spool 30.

The high-speed spool 32 includes an outer shaft 50 that interconnects a high-pressure compressor 52 and high-pressure turbine 54.

The inner shaft 40 and the outer shaft 50 are concentric and rotate via bearing systems 38 about the engine central longitudinal axis A, which is collinear with the longitudinal axes of the inner shaft 40 and the outer shaft 50.

The combustion section 26 includes a circumferentially distributed array of combustors 56 generally arranged axially between the high-pressure compressor 52 and the high-pressure turbine 54.

In some non-limiting examples, the engine 20 is a high-bypass geared aircraft engine. In a further example, the engine 20 bypass ratio is greater than about six (6 to 1).

The geared architecture 48 of the example engine 20 includes an epicyclic gear train, such as a planetary gear system or other gear system. The example epicyclic gear train has a gear reduction ratio of greater than about 2.3 (2.3 to 1).

The low-pressure turbine 46 pressure ratio is pressure measured prior to inlet of low-pressure turbine 46 as related to the pressure at the outlet of the low-pressure turbine 46 prior to an exhaust nozzle of the engine 20. In one non-limiting embodiment, the bypass ratio of the engine 20 is greater than about ten (10 to 1), the fan diameter is significantly larger than that of the low pressure compressor 44, and the low-pressure turbine 46 has a pressure ratio that is greater than about 5 (5 to 1). The geared architecture 48 of this embodiment is an epicyclic gear train with a gear reduction ratio of greater than about 2.5 (2.5 to 1). It should be understood, however, that the above parameters are only exemplary of one embodiment of a geared architecture engine and that the present disclosure is applicable to other gas turbine engines including direct drive turbofans.

In this embodiment of the example engine 20, a significant amount of thrust is provided by the bypass flow B due to the high bypass ratio. The fan section 22 of the engine 20 is designed for a particular flight condition—typically cruise at about 0.8 Mach and about 35,000 feet. This flight condition, with the engine 20 at its best fuel consumption, is also known as "Bucket Cruise" Thrust Specific Fuel Consumption (TSFC). TSFC is an industry standard parameter of fuel consumption per unit of thrust.

Fan Pressure Ratio is the pressure ratio across a blade of the fan section 22 without the use of a Fan Exit Guide Vane system. The low Fan Pressure Ratio according to one non-limiting embodiment of the example engine 20 is less than 1.45 (1.45 to 1).

Low Corrected Fan Tip Speed is the actual fan tip speed divided by an industry standard temperature correction of Temperature divided by $518.7^{\wedge}0.5$. The Temperature represents the ambient temperature in degrees Rankine. The Low Corrected Fan Tip Speed according to one non-limiting embodiment of the example engine 20 is less than about 1150 fps (351 m/s).

Figure 2:
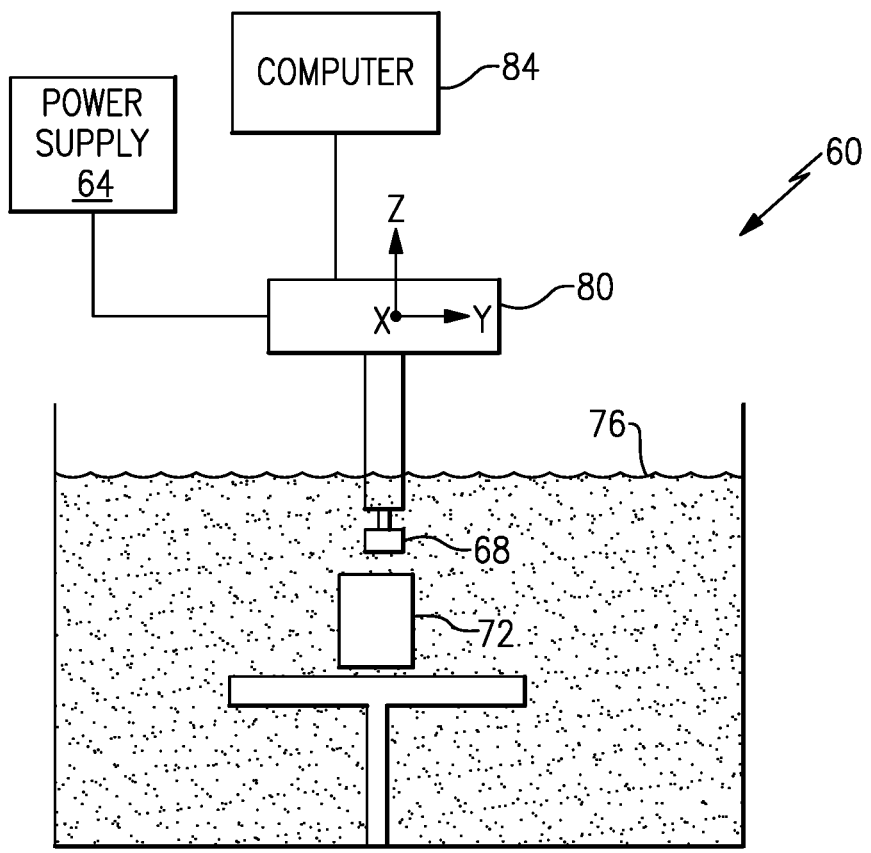
FIG. 2 shows an example electrical discharge machining assembly.

Referring to FIG. 2 with continuing reference to FIG. 1, an example electrical discharge machining assembly 60 includes a power supply 64 that provides a current to an electrical discharge machining electrode 68 to form a component from a workpiece 72. The component is a component used in the gas turbine engine 20.

The electrode 68 and the workpiece 72 are immersed within a fluid 76 during the electrical discharge machining process. The electrode 68 is moved by a positional controller 80 to a desired position relative to the workpiece 72 during the electrical discharge machining process. A computer 84 controls the positional controller 80 to control the position of the electrode 68 and the power delivered to the electrode 68 to control how the electrode 68 shapes the workpiece 72.

Figure 3:
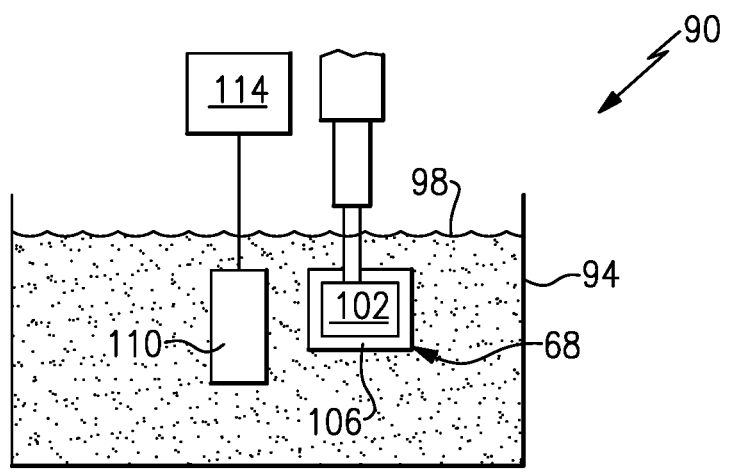
FIG. 3 shows an example assembly used to produce an electrode for use in the electrical discharge assembly of FIG. 2.

Referring to FIG. 3 with continuing reference to FIG. 2, an electroplating assembly 90 used to manufacture the electrode 68 includes a tank 94 holding a fluid 98. A electrode base 102 is immersed within the fluid 98, which contains a diamond material. A electrode coating 106 containing the diamond material is secured to the electrode base 102. The electrode 68 is a shaped electrode in this example.

An electroplating process is used to secure the electrode coating 106 to the electrode base 102. During the electroplating, a current flows to an anode 110 from a power supply 114. The anode 110 is immersed within the fluid 98. The electrode base 102 acts as a cathode, and the fluid 98 as an electrolyte. Supplying current to the anode 110 dissolves metal atoms of the anode 110. These dissolved metal ions plate out onto the electrode base 102 together with a diamond material as the coating 106.

The coating 106 may include a chemical vapor deposition diamond material or a polycrystalline diamond material. The polycrystalline diamond material may be sintered with boron. In some examples, the electrode 68 is a copperless electrode as the electrode 68 may contain no copper. In some examples, the electrode 68 is a graphiteless electrode as the electrode 68 may contain no graphite. In these examples, brazing is not required to secure the coating 106 to the electrode base 102.

Prior to being electroplated to the electrode base 102, the diamond material may form some or all of the fluid 98 within the tank 94. Alternatively, some or all of the diamond material may be solid diamond crystals suspended within the fluid 98.

The diamond material of the coating 106 protects the electrode base 102 and prevents substantial portions the electrode 68 from being consumed during electrical discharge machining. The electrode 68 is thus reusable and non-consumable. In some examples, the useful life of the electrode 68 may be from 10 to 100 times greater than the useful life of a prior art electrode.

In some examples, the crystal graphic direction of the coating 106 is [111] or aligned within a cone that is from 10 to 15 degrees of [111].

Figure 4:
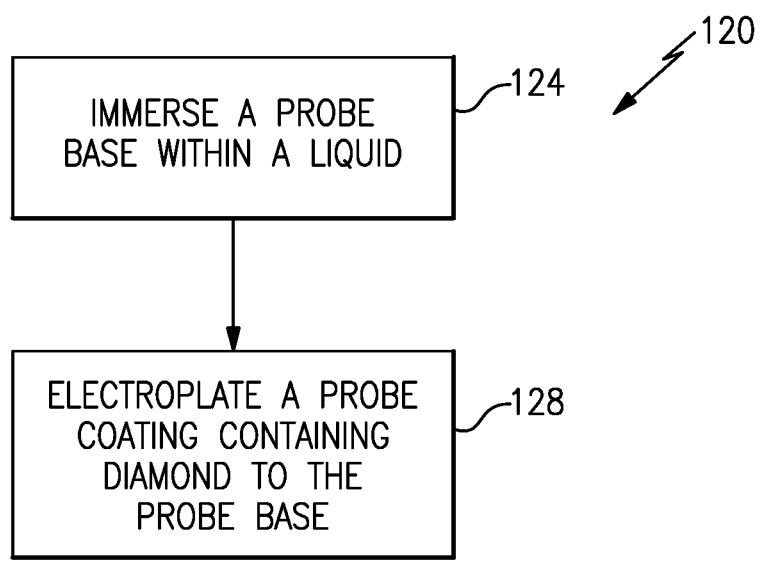
FIG. 4 shows a flow of an example method of manufacturing an electrical discharge machining electrode for use in the assembly of FIG. 2.

Referring to FIG. 4 with continuing reference to FIG. 3, an example method 120 of manufacturing the electrical discharge machining electrode 68 includes a step 124 of immersing the electrode base 102 within the fluid 98. The method 120 includes a step 128 of electroplating the electrode coating 106 containing diamond to the electrode base 102.

Figure 5:
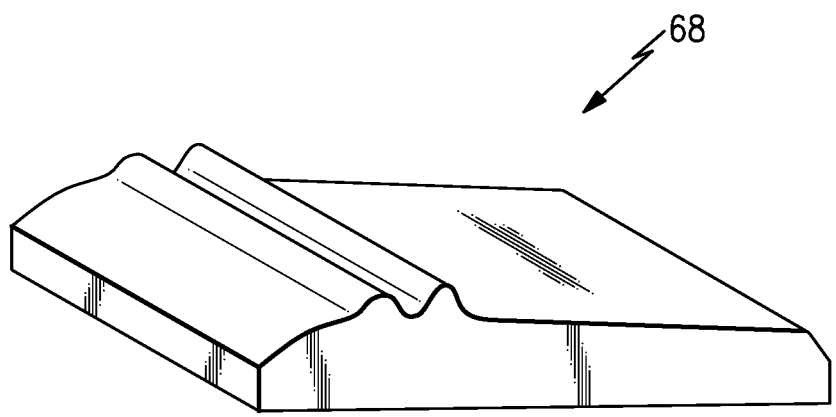
FIG. 5 shows a perspective view of an example electrode used within the assembly of FIG. 3.
Figure 6:
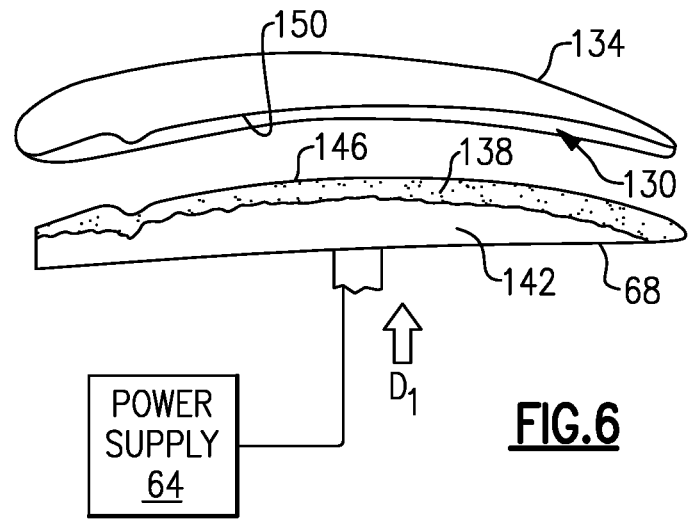
FIG. 6 shows a top view of the electrode of FIG. 4 together with a component.
Figure 7:
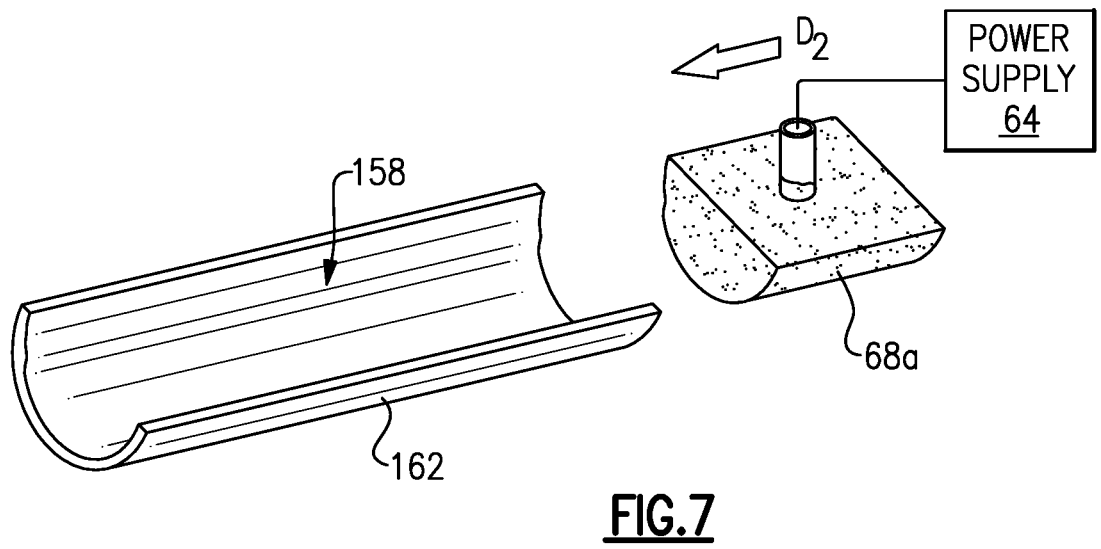
FIG. 7 shows another example electrode suitable for use within the assembly of FIG. 3 together with another component.

Referring to FIGS. 5 and 6 with continuing reference to FIGS. 1 to 4, the example electrode 68 may be used to form a blade shelf 130 within a blade tip 134 of a blade from the high pressure turbine 26 of the gas turbine engine 20. The electrode 68 electrically discharge machines the blade tip 134. The electrode 68 includes an area 138 electroplated with the material that contains a diamond. The electrode includes another area 142 that uncoated. That is, the area 142 is not electroplated with any material containing diamond. The uncoated area 142 may be provided by masking select areas of the electrode 68 during the electroplating method 120. The masking (not shown) is substantially waterproof in some examples.

The electrode 68 receives a current from the power supply 64 and is selectively moved toward the blade 134 in a direction $D_1$ to form the blade shelf 130. The electrode 68 has a contour 146 mimicking a desired contour 150 of the blade shelf 130.

Another example electrode 68a suitable for use within the assembly 60 is used to form a desired contour 158 within a fan blade sheath 162. In this example, substantially all the outer surfaces of the electrode 68a are electroplated with a material containing diamond.

To form the desired contour 158, the electrode 68a is provided with a current from the power supply 64. The electrode 68a is moved along the blade sheath 162 in a direction $D_2$ to form the desired contour 158 by removing material from the undesired areas of the blade sheath 162. Other example components formed using other variations of the electrode 68 may include trailing edges of vanes and blades, or feather seal slots. Several different variations of the electrode 68 may be used to form a single vane or blade of the gas turbine engine 20.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A method of manufacturing an electrical discharge machining electrode, comprising: immersing at least a portion of an electrode base in a fluid; and electroplating an electrode coating containing diamond to the electrode base, wherein the crystal graphic direction of the electrode coating on the electrode base is [111].

2. The method of manufacturing an electrical discharge machining electrode of claim 1, wherein the electrode coating is formed from a fluid containing a diamond material.

3. A method of machining, comprising: immersing at least a portion of an electrode base in a fluid; electroplating an electrode coating containing diamond to the lectrode base to provide an electrical discharge machining electrode, the crystal graphic direction of the electrode coating on the electrode base is [111; and using the electrical discharge machining electrode to electrically discharge machine a first component.

4. The method of machining of claim 3, further comprising reusing the electrical discharge machining electrode to electrically discharge machine a second component.

5. The method of machining of claim 4, wherein the reusing is without replacing or redressing the electrical discharge machining electrode.

6. The method of machining of claim 3, wherein the electrode has a contour mimicking a contour of a turbomachine component of a gas turbine engine.

7. The method of manufacturing an electrical discharge machining electrode of claim 1, wherein the coating containing diamond comprises a chemical vapor deposition diamond.

8. The method of manufacturing an electrical discharge machining electrode of claim 1, wherein the coating containing diamond comprises a polycrystalline diamond.

9. A method of manufacturing an electrical discharge machining electrode, comprising: immersing at least a portion of an electrode base in a fluid; and electroplating an electrode coating that contains diamond to the electrode base to provide an electrical discharge machining electrode, the crystal graphic direction of the electrode coating on the electrode base is [111].

* * * * *